United States Patent [19]

Seaman

[11] 4,281,888
[45] Aug. 4, 1981

[54] APPARATUS FOR TESTING LEADS OF FUSE HOLDERS

[75] Inventor: Gary G. Seaman, Broomfield, Colo.

[73] Assignee: Western Electric Company, Inc., New York, N.Y.

[21] Appl. No.: 73,347

[22] Filed: Sep. 7, 1979

[51] Int. Cl.³ .............................................. H01R 9/00
[52] U.S. Cl. ........................ 339/151 B; 339/108 TP; 339/150 B; 339/255 R
[58] Field of Search ......... 339/108 R, 108 TP, 147 P, 339/149 P, 150 B, 151 B, 176 R, 252 R, 252 P, 255 R; 324/158 P

[56] References Cited

U.S. PATENT DOCUMENTS

| | | | |
|---|---|---|---|
| 3,865,463 | 2/1975 | Busch | 339/108 TP |
| 4,061,969 | 12/1977 | Dean | 324/158 P |
| 4,168,873 | 9/1979 | Luna | 339/255 R |
| 4,200,351 | 4/1980 | Long et al. | 339/255 R |

FOREIGN PATENT DOCUMENTS

| | | | |
|---|---|---|---|
| 1363518 | 5/1964 | France | 339/252 P |
| 639059 | 12/1978 | U.S.S.R. | 339/252 P |

*Primary Examiner*—John McQuade
*Attorney, Agent, or Firm*—J. J. Jordan; J. L. Landis

[57] ABSTRACT

A fuse holder tester (50) is arranged with a plurality of conductive, resiliently mounted contact fingers (51, 52), for making electrical contact with leads (11, 12) embedded in the walls of the fuse holder (10). The tester also includes a spring-loaded probe (58) arranged to make contact with a third lead (13) located at the base of the fuse holder, upon insertion of the tester into the holder. In one example, a testing assembly (70) is provided, having six of the testers (50) capable of being simultaneously inserted into a typical fuse block (30) having six of the fuse holders (10).

6 Claims, 4 Drawing Figures

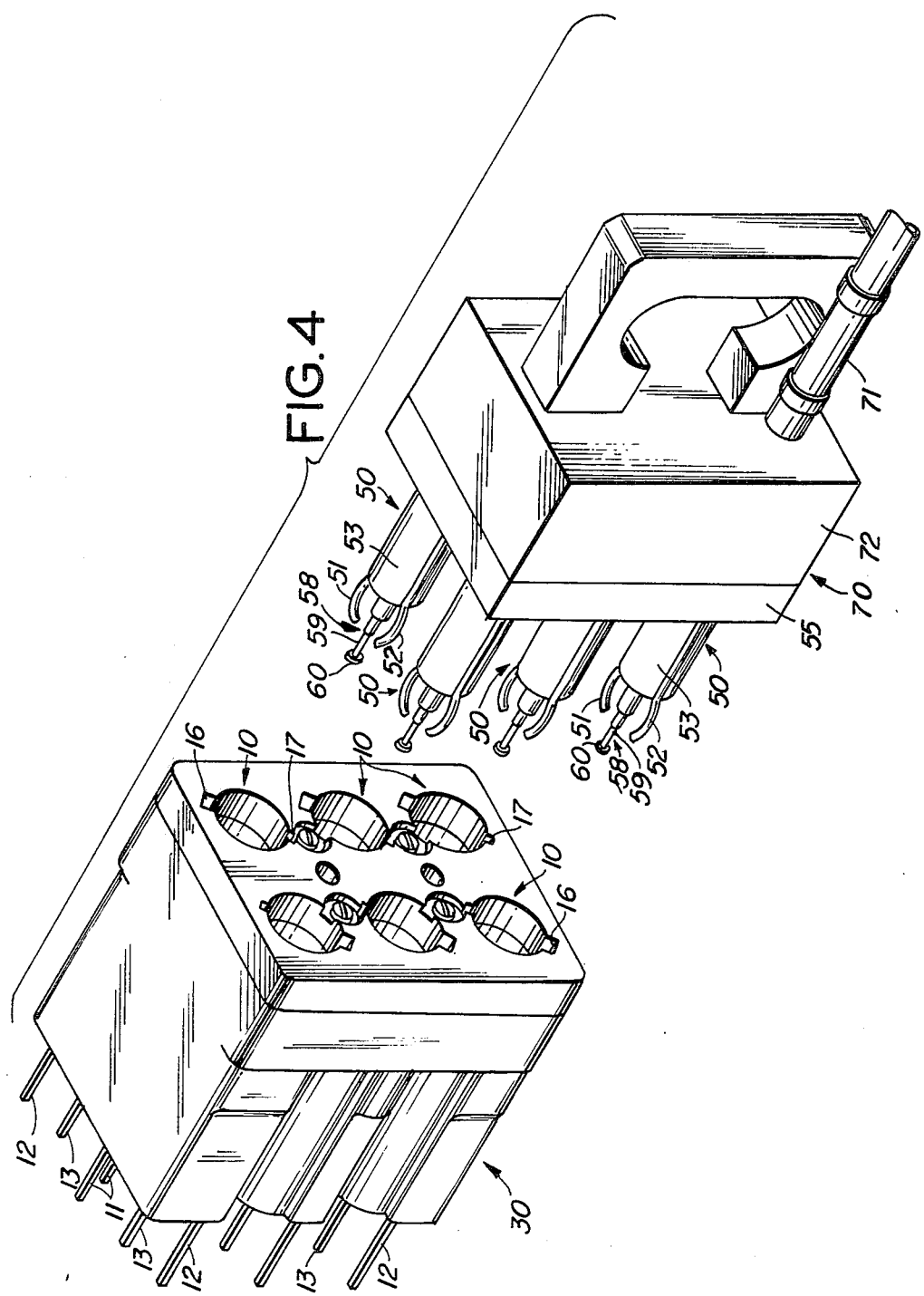

4,281,888

APPARATUS FOR TESTING LEADS OF FUSE HOLDERS

TECHNICAL FIELD

This application relates generally to test apparatus for providing electrical connections and in particular to test apparatus for providing electrical connections with leads located in fuse holders to permit testing of attached circuitry.

BACKGROUND OF THE INVENTION

Many of the circuits used in telephone central offices have fuse devices located in the circuits to protect the equipment from current surges. Typical of the fuses used in these arrangements is the 70 type, or tubular shaped, fuse (manufactured by Western Electric Company, Incorporated of New York, N.Y.), which is inserted into a fuse holder for connection to the electrical circuit which it protects. The fuse holder has a tubular shaped opening designed to accept the fuse and has two leads embedded in the walls of the opening and one lead coiled at the bottom of the opening.

Frequently, circuits using tubular type fuses must be tested to assure proper electrical continuity. Since the fuse holder for tubular type fuses has two leads embedded in the wall of the tubular opening, making electrical contact with these leads has proved to be physically difficult. In one previous arrangement, a dummy tubular fuse is inserted into each fuse holder opening and, because of the location of the embedded leads, is turned by the test operator until electrical contact is made with each embedded lead for test purposes. However, this arrangement is time consuming and, because of the numerous inserting, turning and pulling out operations of the dummy fuse by the test set operator during the work day, has resulted in operator fatigue and in poor test results.

SUMMARY OF THE INVENTION

General objects of this invention are to provide a single apparatus for making electrical connections with a plurality of leads located in a fuse holder which apparatus can be used to replace the present dummy fuse test apparatus. Some advantages resulting from use of the invention are:

(a) reduction in the amount of time required to perform each test because of ease of making electrical contact with leads to be tested;

(b) decrease in operator fatigue due to the elimination of twisting by the operator to properly seat the test apparatus; and (c) ability to test a plurality of fuse holders with a single insertion.

A specific object of the invention is to provide means for easily making solid electrical contact with the leads in a fuse holder to permit electrical testing.

A further object is to provide apparatus for making electrical contact with all the leads in a fuse holder by inserting the apparatus into the holder without having to turn the apparatus.

With the foregoing and other objects in view, improved testing apparatus, in accordance with certain features of the invention, for making an electrical connection with a plurality of leads contained in a fuse holder utilizes a body shaped to fit into the holder. The apparatus further includes a plurality of resiliently mounted fingers of conductive material extending along the length of the body and a plunger type probe located at the end of the body which is first inserted into the holder such that, as the body is inserted into the holder, the resiliently mounted fingers and plunger type probe make individual physical contact and electrical connection with the contained leads. Preferably, the fuse holder is shaped to accept tubular type fuses and the body is tubular shaped.

In another embodiment of this invention, the apparatus is arranged in an assembly of six bodies so as to be inserted into a fuse block of six holders for easy testing of leads contained in the six holders.

BRIEF DESCRIPTION OF THE DRAWINGS

Other objects, features and advantages of the invention, its organization, construction and operation will be best understood from the following detailed description of a specific embodiment thereof, taken in conjunction with the accompanying drawings in which:

FIG. 4 is a perspective view of a test assembly, having six fuse holder testers, and a fuse block arranged to show the mating relationship between the test assembly and the block.

DETAILED DESCRIPTION

Introduction and Background

Figure 1:
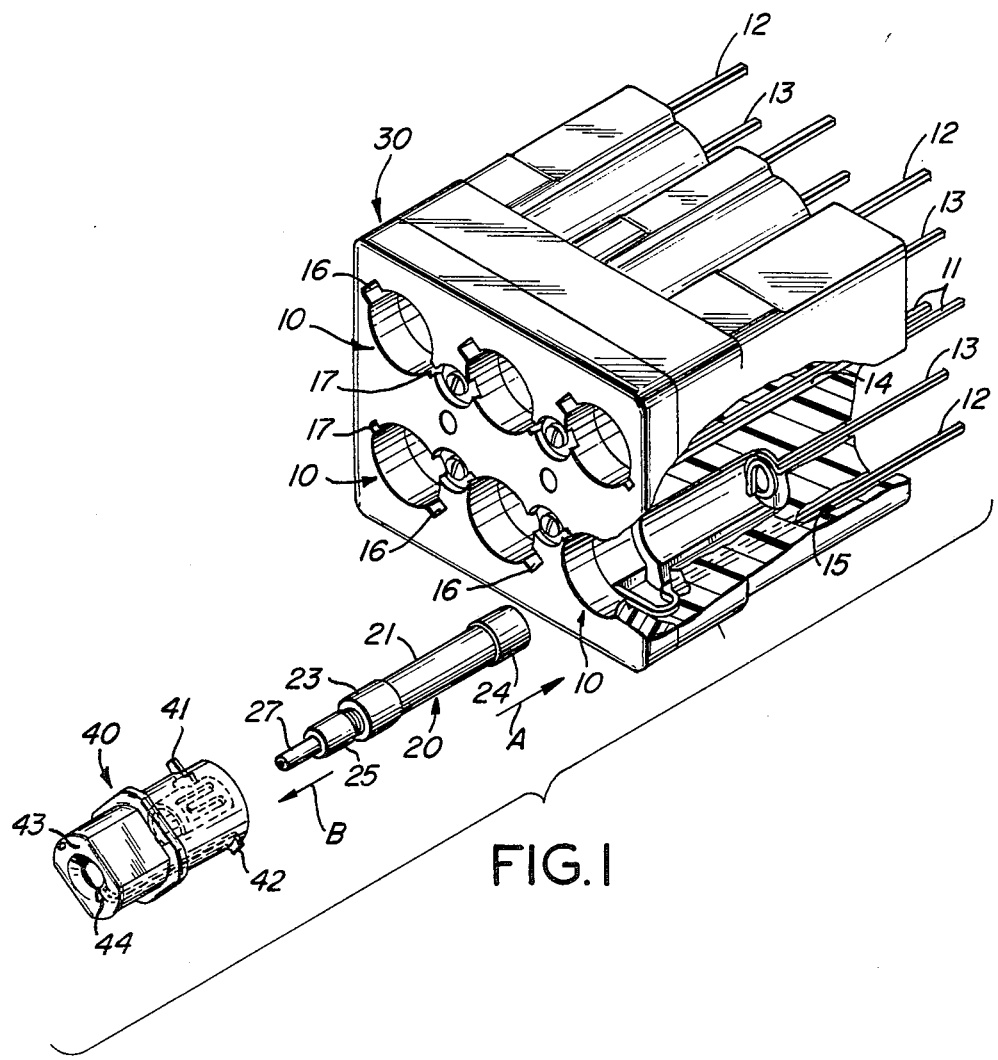
FIG. 1 is a perspective view of a fuse block having six fuse holders, with a portion cut away on one holder to show the typical location of leads embedded in the holders.

Referring now in detail to the drawings, a panel or array of fuse holders 10—10 is shown in FIG. 1, each having a central tubular opening or socket into which a fuse 20 is to be inserted (arrow A). In the example illustrated, six individual fuse holders 10 are arranged in two rows of three fuse holders each as part of a fuse block 30 such as is commonly used in the telephone industry and is similar to the Western Electric 29A fuse block. In FIG. 1, the lower right fuse holder 10 of the cluster has been cut away in the drawing to more clearly show the relevant construction of that fuse holder, which is representative of all fuse holders 10 in the block 30.

Figure 2:
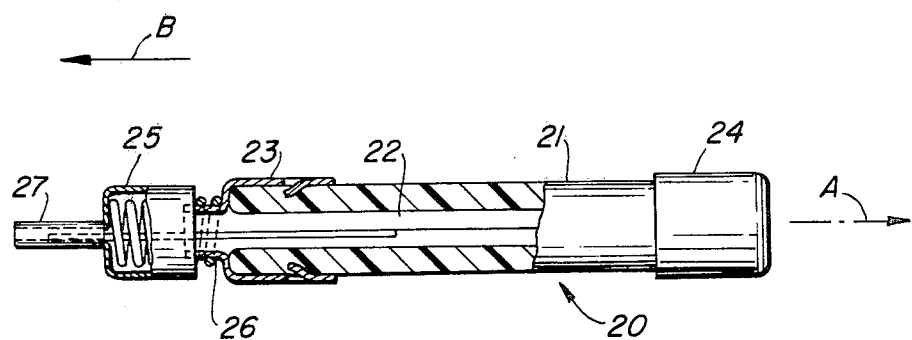
FIG. 2 is a plan view of a tubular type fuse which can be mounted in each of the holders, with portions broken away to reveal structural details.

Designed to hold a tubular fuse 20 of the type shown in FIGS. 1-2, the fuse holder 10 as seen in FIG. 1 has two leads 11-12 embedded on opposite sides of the socket and one lead 13 located at the base of the socket. Each of the three leads is electrically isolated from the other two. Leads 11-12 are embedded in individual slots 14-15 located in the wall of fuse holder 10 as shown in the cutaway portion of FIG. 1 and as such do not make direct electrical contact with any portion of an inserted fuse 20, which direct electrical contacts will be described below. Lead 13 is coiled at the bottom of fuse holder 10 to allow for good direct electrical contact when a fuse is inserted into the holder and also to provide for some resiliency to hold the fuse in place.

Lead 11 located in the side of holder 10 and coiled lead 13 are part of the electrical circuit into which the fuse 20 is electrically connected. Lead 11 is typically the "hot" lead while lead 13 is typically connected to ground. The remaining lead 12 embedded in the side of holder 20 is called the alarm lead and its significance will be explained below.

The tubular fuse 20, shown in detail in FIG. 2, includes a tube 21 of insulating material containing an elongated fusible element 22 in the center of the tube, typically a resistance wire which will melt when current flowing through the wire exceeds a predetermined value established for the particular fuse, as is well known. The fuse 20 also includes a pair of conductive metal caps or ferrules 23 and 24 fastened over the ends of the tube 21, and an alarm cap 25 slidably mounted to the left end (FIG. 2) of the fuse by a coil spring 26, which in turn is connected to the ferrule 23. The fusible element 20 is electrically connected at the right end to the ferrule 24 and at the left end to the spring 26, which in turn is connected to the ferrule 23 at the left and the alarm cap 25. When an electrical overload occurs in the circuit in which tubular fuse 20 is connected, the fusable element 22 melts, releasing the coil spring 26 to push the alarm cap 25 out in the direction shown by arrow B of FIG. 1. The alarm cap 25 remains in electrical contact with the ferrule 23, while electrical contact is broken, or open, between the ferrule 23 and the ferrule 24 as is well known in the art.

As seen in FIG. 1, the fuse 20 is inserted into the fuse holder 10 in the direction of arrow A, with the alarm cap 25 protruding out from the end of the holder, from the left front face of the fuse block 30 in FIG. 1. When inserted in holder 10, the ferrule 24 makes electrical contact with the central lead 13 located at the inner end of the holder 10. However, in order for an inserted fuse 20 to make electrical contact with the embedded leads 11-12 and to be securely held in holder 10, a tubular fuse cover 40 (FIG. 1) must be placed over the fuse and fitted into the holder 10. The alarm cap 25 fits into the fuse cover 40, which has two conductive metal ears 41 and 42 jutting from each side of the cover. Ear 42 is wider than ear 41 and is arranged dimensionally to fit into a longitudinal slot 16 at the front of the holder 10, while the smaller ear 41 fits into a smaller slot 17 of the holder.

When the cover 40 is properly aligned with the openings 16 and 17 and is inserted into the fuse holder 10 over the alarm cap 25 of an associated fuse 20, the ear 42 makes electrical contact with the embedded alarm lead 12 while the ear 41 makes contact with the embedded hot lead 11. As seen in the cutaway portion of the cover 40, the ear 42 extends along the side of cover 40, but is electrically isolated from the opening in which the alarm cap 25 fits, until it extends as an inwardly directed tang 44 adjacent to the left end 43 (FIG. 1) of the cover. The ear 41 extends through the wall of cover 40 and partially around the inside of the surface at the open end of the cover such that it can come into physical and electrical contact with the ferrule 23 of the associated fuse 20. Thus, as the cover 40 is fitted over the alarm cap 25 and pushed into the fuse holder 10, the ear 41 makes electrical contact with the hot lead 11 and with the ferrule 23 of the fuse 20, while the ear 42 is in electrical contact with the alarm lead 11, but is not in electrical contact with any portion of the fuse 20 since the alarm cap 25 does not normally extend sufficiently outward (to the left in FIG. 1) to contact the tang 44.

However, when the fuse blows and the spring 26 forces the metal alarm cap 25 outward (arrow B), the cap 25 makes electrical contact with the tang 44 of the ear 42, which is electrically connected to the alarm lead 12. Thus, when the fuse 20 operates, the hot lead 11 is now connected to the alarm lead 12 through the ferrule 23, the coil spring 26, the alarm cap 25, and the ear 42. The other end of the alarm lead 12 is connected to an alarm circuit, which operates to notify maintenance personnel that a malfunction has occurred.

Each fuse 20 also has a colored projection or teat 27 at the outer end of the alarm cap 25, which is projected outward (arrow B) when the fuse 20 operates to extend through an opening in the cover 40 to give a visual indication as to which fuse has blown.

Typically, the fuses 20 are located in a panel having a plurality of fuse blocks 30. Thus, when an individual fuse blows and an alarm is signaled, the maintenance personnel respond by going to the fuse panel and checking to visually determine which of the fuses has operated by seeing which colored teat 27 has been extended.

This Invention

Figure 3:
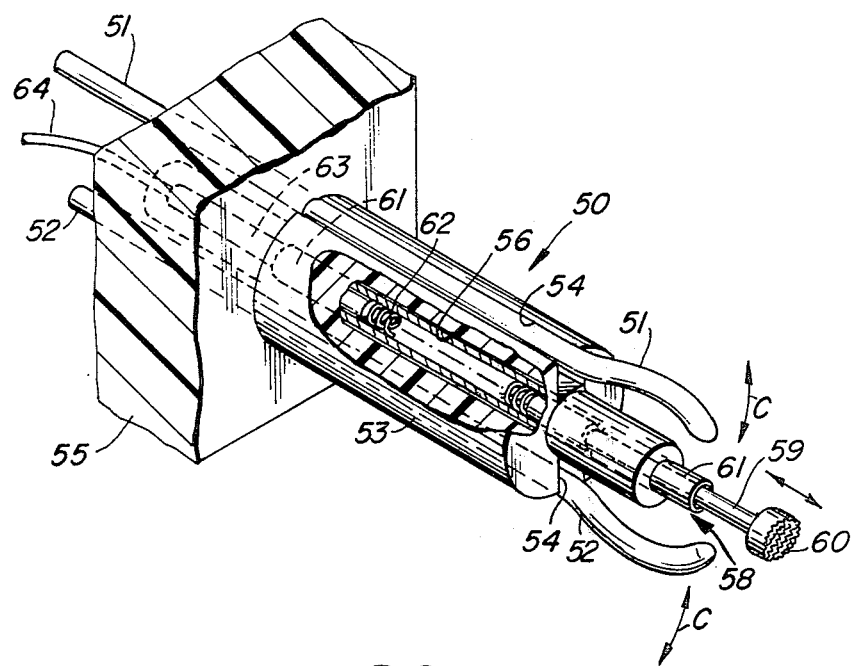
FIG. 3 is a perspective view of a fuse holder tester with a portion cut away to show arrangements of conductive fingers and a plunger type probe located on the tester.

This application relates to a testing apparatus or tester 50 illustrated in FIGS. 3-4 for testing fuse holders 10 of the type described in the preceding sections. In particular, in order for any fuse 20 to operate properly and indicate an alarm condition, the leads 11, 12, 13 in each fuse holder 10 must have electrical continuity. Since the leads 11 and 12 are embedded in the walls of fuse holder 10 and since the lead 13 is located at the end of the socket of the fuse holder, it is extremely difficult to physically make contact with each of the three leads in order to test for electrical continuity, as described previously under "Background of the Invention". A tester 50 in accordance with this invention is designed to be inserted into the fuse holder 10 so that the necessary electrical contacts with each of the three leads 11, 12, 13 can be easily made for test purposes as described below. Preferably, six of the testers 50 are arranged in a test unit 70, comprising two rows of three testers each as shown in FIG. 4, to allow for simultaneous quick testing of six fuse holders 10 arranged in a fuse block 30.

As illustrated in FIGS. 3 and 4, each tester 50 includes two elongated spring contact fingers 51-52, which are mounted on a central body or mounting member 53 so that the member 53 may be inserted into a fuse holder 10 and the fingers 51-52 make electrical contact with the leads 11-12, embedded in the wall of the fuse holder 10, as previously described. The fingers 51-52 are fabricated from an electrically conductive spring metal, such as phosphor bronze, so as to allow for electrical testing of the leads 11-12.

The mounting member 53 preferably comprises a cylindrical mounting body of an electrically insulating material such as a linen phenolic or nylon, having a pair of opposed longitudinal grooves 54—54 in the side walls thereof, within which generally straight midsections of the contact fingers 51 and 52 are received as illustrated in FIGS. 3-4. In the specific embodiment illustrated, a plurality of the mounting members, six in this example, are fastened to a rectangular insulating base block 55, so that the outer ends (left in FIG. 3) of the contact fingers 51-52 are fastened to the base block 55 and have tips extending therethrough to the left as shown in FIG. 3 so as to permit connection of an electrical conductor (not shown) to each finger 51-52 at the outer end. The electrical conductor may be terminated in any well known way, such as wire wrapping or soldering for connecting the fingers 51-52 to a test set; for example, by means of a conventional cable 71 shown in FIG. 4.

Accordingly, with the outer ends of the spring contact members 51 and 52 fixed in the base block 55 and the straight midsections received loosely in the grooves 54 of the body member 53, the inner or free ends of the fingers are free to pivot radially inward and outward toward and away from the center of the body member 53 as indicated by arrows C—C in FIG. 3. The U-shaped grooves 54—54 prevent the corresponding fingers 51-52 from moving in a lateral direction. The free end of each finger 51-52 is shaped in an arc or bulge which initially extends out and away from the body 53 at a slight angle and then curves back toward the center line of body 53 as shown in FIG. 3.

An axial bore 56 runs through the center of the body member 53, in which is mounted a generally conventional spring-loaded test probe 58 for contacting the central lead 13 of the fuse holder 10. The probe 58 includes a spring-loaded plunger 59, which extends outward from the inner end of the body 53 between and beyond the arced ends of fingers 51-52, as shown in FIGS. 3 and 4. The plunger 59 is terminated in a serrated contact tip 60 for contacting the coiled outer end of the lead 13. The plunger 59 is reciprocably mounted in a tubular barrel 61, and a conductive biasing spring 62 in the barrel normally positions the plunger 59 in an extended forward position shown in FIG. 3. The spring 62 is electrically connected to the inner end of the plunger 59 and to the barrel 61, thus providing a continuous electrical path from the tip 60 to the outer end of the barrel 61, the left end in FIG. 3. The left end of the barrel 61 in turn is connected to a terminal 63 extending to the left in FIG. 3, to which is connected a conductor 64 that extends through the base block 55 to the left in FIG. 3 for connection to the test set in any conventional fashion.

In the embodiment illustrated, the probe 58 is so positioned in the body 53 that when the tester 50 is fully inserted into fuse holder 10, the tip 60 contacts the lead 13 and the plunger 59 is moved back into barrel 61 an amount equivalent to approximately 50 percent of its allowable travel. This arrangement allows for small variations in the height of the lead 13 in the fuse holder 10 and assures positive electrical contact of the tip 60 with the lead 13. Any number of different commercially available plunger type probes may be used, such as a Pogo ® Contact P2665-2W, manufactured by Pylon Company Inc. of Attleboro, Mass.

In a preferred embodiment, six of the testers 50 are mounted on a single base block 55 in two rows of three testers in each row as shown in FIG. 4 and the base block 55 is fastened to a handle assembly 72 to form the composite test unit 70 as previously described. The handle assembly 72 is formed with a bore, through which the connecting cable 71 extends for connection to a test set. In this example, the cable 71 contains six sets of three leads, each set being associated with one of the testers 50 and each of the three leads in each set being connected to one of the terminals 51-52 or probe 58 as discussed above and seen in FIG. 3. A typical continuity test set of this type is the Teradyne N151 Interconnection Test System, manufactured by Teradyne, Inc. of Boston, Mass.

With the arrangement shown in FIG. 4, when the six testers 50 mounted on the handle assembly 72 are inserted into six fuse holders 10 on the fuse block 30, the spring contact fingers 51-52 of each tester 50 are initially cammed inwardly by the walls of each holder until the arc, or bulge, portion of each finger clears the outer ring of each holder, after which the fingers 51-52 spring outward so that the bulge portion of each finger resiliently engages a corresponding lead 11 or 12 embedded in the wall of the holder by mechanical spring action, to make and hold a secure electrical contact between the fingers 51-52 and the corresponding embedded leads 11-12. Simultaneously, as the test assembly 70 is pushed inward into the fuse block 30, the tip 60 of each probe 58 contacts with the corresponding lead 13 of fuse holder 10. When the six testers 50 have been fully inserted into the six fuse holders 10, each lead 11, 12, 13 of each holder 10 is individually in electrical contact with a corresponding finger 51-52 or probe 58 and can be tested for electrical continuity through the cable 71.

With this arrangement, a test set operator can easily make secure electrical contact with the embedded leads 11 and 12 and with the recessed central contact 13 of six fuse holders for the duration of the test, merely by inserting one composite test unit 70 into the fuse block 30. As previously mentioned, a significant advantage of this method is that the operator no longer is required to turn a dummy fuse in each holder to make electrical contact with the embedded leads 11-12.

While one specific embodiment of the invention has been described in detail above, it will be obvious that various modifications may be made from the specific details described without departing from the spirit and scope of the invention.

What is claimed is:

1. Apparatus for providing electrical contact with a plurality of leads individually located in the walls and at the base of a fuse holder socket shaped to accept a tubular fuse, the apparatus comprising:
   a tubular body arranged to fit into the socket;
   a base attached to one end of the body;
   a plurality of free ended spring fingers of conductive material extending from the base along the length of the tubular body, the free ends of the spring fingers projecting outward from the body and capable of moving toward and away from the body;
   an electrical lead extending through the center of the body to the base; and
   a spring-loaded probe extending from the end of the body opposite the base and connected to the central electrical lead;
   the parts being so constructed and arranged that, when the body is inserted into the socket, the plurality of spring fingers are initially cammed inwardly by the walls of the socket, following which the plurality of fingers spring outwardly to physically and electrically contact associated ones of the plurality of leads located in the walls of the socket and, as the probe comes into contact with the lead at the base of the socket, it is forced rearward with respect to the body so as to assure good electrical contact.

2. Apparatus as recited in claim 1, wherein portions of the fingers and the electrical lead extend out from the base for providing electrical connections to a test set.

3. Apparatus as recited in claim 1, wherein the leads located in the walls of the socket comprise two leads embedded in slots formed in the walls of the socket and located on opposite sides of the socket; and
   wherein the spring fingers comprise two fingers positioned on opposite sides of the body so as to make physical and electrical contact with the two embedded leads upon insertion of the body into the socket.

4. Apparatus for making temporary electrical contact with a plurality of conductive leads provided in and along the walls of a receiving socket of a fuse holder for continuity testing of the leads, at least one of the leads being a longitudinal lead embedded in a side wall of the socket, which apparatus comprises:

an insulating support member having a front end adapted to be inserted into the socket;

a plurality of individual spring contact members separately mounted on the support member and so arranged with respect to the leads in the socket that, when the support member is inserted into the socket, front end portions of the spring contact members resiliently engage portions of the corresponding leads in the socket to make secure electrical contact therewith;

at least one of the contact members being an elongated conductive spring contact finger fixed at a rear end thereof to the support member and having a curved free end extending outwardly of the support member beyond the front end thereof, the finger being so arranged with respect to the socket and the embedded lead that, when the support member is inserted into the socket, the finger is initially cammed inwardly by portions of the socket, following which the finger springs outwardly so that the curved free end makes resilient contact with the embedded lead; and means for providing electrical connections to the opposite ends of each of the contact members for connection to a continuity testing apparatus.

5. Apparatus as recited in claim 4, wherein the support member is formed with an elongated longitudinal groove running from a point adjacent to the rear end thereof, at which the rear end of the contact finger is fixed, to the front end thereof; and the contact finger includes a straight midsection received in the groove so that the finger is free to pivot in the groove about the fixed end radially inward and outward with respect to the support member, the curved free end extending outwardly from the front end of the midsection.

6. Apparatus as recited in claim 5, wherein the socket is a tubular socket provided with two embedded longitudinal leads spaced 180° apart;

the apparatus includes two of the elongated spring contact fingers mounted in two longitudinal grooves formed in the periphery of the support member 180° apart; and the socket is formed with a pair of entrance slots at the front end thereof aligned with the embedded leads and of a size to receive and orient the free ends of the contact fingers.

* * * * *